United States Patent
Suzuki et al.

(10) Patent No.: US 11,512,942 B2
(45) Date of Patent: *Nov. 29, 2022

(54) DISPLACEMENT DETECTION DEVICE

(71) Applicant: Dmg Mori Co., Ltd., Nara (JP)

(72) Inventors: Akinori Suzuki, Kanagawa (JP); Masayuki Niiya, Kanagawa (JP); Kenji Matsushita, Kanagawa (JP); Terukazu Nishida, Kanagawa (JP); Hideaki Tamiya, Kanagawa (JP); Kayoko Taniguchi, Kanagawa (JP)

(73) Assignee: Dmg Mori Co., Ltd., Nara (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/690,000

(22) Filed: Nov. 20, 2019

(65) Prior Publication Data

US 2020/0158494 A1  May 21, 2020

(30) Foreign Application Priority Data

Nov. 20, 2018 (JP) .............................. JP2018-217762

(51) Int. Cl.
*G01B 11/16* (2006.01)
*G01B 9/02055* (2022.01)
(Continued)

(52) U.S. Cl.
CPC ........ *G01B 11/168* (2013.01); *G01B 9/02058* (2013.01); *G01B 9/02081* (2013.01);
(Continued)

(58) Field of Classification Search
CPC ............ G01B 9/02058; G01B 9/02081; G01B 11/168; G01B 2290/45; G01B 2290/70; G01D 5/266; G01D 5/268; G01D 5/344
See application file for complete search history.

(56) References Cited

U.S. PATENT DOCUMENTS 5,120,130 A  6/1992 Bergh
9,810,521 B2 * 11/2017 Suzuki ................ G01B 9/0209
(Continued)

FOREIGN PATENT DOCUMENTS

| JP | H7-332957   | 12/1995 |
| JP | 2006-194855 | 7/2006  |
| JP | 2016-142552 | 8/2016  |

OTHER PUBLICATIONS

Kazumasa, Takada et al., Polarization Crosstalk Dependence on Length in Silica-Based Waveguides Measured by Using Optical Low Coherence Interference, Journal of Lightwave Technology, IEEE, USA, vol. 16. No. 8, Aug. 1998.

*Primary Examiner* — Michael A Lyons
(74) *Attorney, Agent, or Firm* — David R. Stevens; Stevens Law Group

(57) ABSTRACT

A displacement detection device is capable of stably and accurately detecting an amount of displacement. A polarization maintaining fiber has a length not to be equal to a length obtained by dividing, a product of an integral multiple of twice a length of a resonator times a refractive index of the resonator and a beat length obtained from a difference between propagation constants of two polarization modes, by a wavelength of the light source, is selected from a range including a length equal to the above length. The polarization maintaining fiber includes multiple polarization maintaining fibers fitted to each other by removable connectors.

2 Claims, 8 Drawing Sheets

(51) Int. Cl.
*G01B 9/02056* (2022.01)
*G03F 9/00* (2006.01)
*H01J 37/304* (2006.01)
*G01D 5/38* (2006.01)
*G01D 5/34* (2006.01)
*G01D 5/26* (2006.01)
*G11B 7/26* (2006.01)

(52) U.S. Cl.
CPC ............ *G01D 5/266* (2013.01); *G01D 5/268* (2013.01); *G01D 5/344* (2013.01); *G01D 5/38* (2013.01); *G03F 9/7026* (2013.01); *H01J 37/3045* (2013.01); *G01B 2290/45* (2013.01); *G01B 2290/70* (2013.01); *G11B 7/261* (2013.01)

(56) References Cited

U.S. PATENT DOCUMENTS

2009/0268210 A1* 10/2009 Prince ................. G01D 5/38
356/494
2012/0287441 A1* 11/2012 Kuroda ................. G01B 11/02
356/499
2016/0223317 A1 8/2016 Suzuki

* cited by examiner

DISPLACEMENT DETECTION DEVICE

BACKGROUND OF THE INVENTION

Field of the Invention

The present invention relates to a displacement detection device for detecting displacement of a surface to be measured, by using light emitted from a light source. In addition, the present application claims priority based on Japanese Patent Application No. 2018-217762 filed in Japan on Nov. 20, 2018, which is incorporated by reference herein.

Description of Related Art

From the past, a displacement detection device using light has been utilized widely as a contactless measuring device of displacement of a surface to be measured. About concrete configuration of the displacement detection device, there are various types, and they will be described later in embodiments, but in any type, the displacement detection device is having a configuration to guide light from a light source to the displacement detection device through an optical fiber. And, the displacement detection device detects an amount of displacement of a surface to be measured by changing phase of light from the light source based on displacement of the surface to be measured, and by detecting changing state of the phase of the light.

Patent Document 1: Japanese Patent Application Laid-Open No. H7-332957
Patent Document 2: Japanese Patent Application Laid-Open No. 2006-194855
Patent Document 3: Japanese Patent Application Laid-Open No. 2016-142552

SUMMARY OF THE INVENTION

When detecting displacement of the surface to be measured by the displacement detecting device, it is important that phase of light reaching a displacement detector from the light source is stable. In other words, there is a risk that unnecessary phase fluctuation of light occurs by bonding state of the optical fiber and a ferrule for connecting optical fibers, or by fitting state of optical fiber connectors, or by application of stress causing a change in a bending state of the optical fiber for guiding light from the light source. When unnecessary phase fluctuation of light occurs, stability in detection of displacement of the surface to be measured by the displacement detector will be decreased, thereby an accuracy of displacement detection will be decreased.

As a method that the unnecessary phase fluctuation of light at the optical fiber does not influence the accuracy of displacement detection by the displacement detector, for example, there is a method to extract and incident optional polarized light on the displacement detector, after depolarizing light emitted from the optical fiber and polarizing depolarized light by a polarizer (refer to Patent Literature 1).

In addition, as another method, there is a method to reduce unnecessary polarization component of light by using a polarization maintaining fiber as the optical fiber, and by increasing extinction ratio of light incident on the polarization maintaining fiber (refer to Patent Literature 2).

In the method to polarize depolarized light by the polarizer after depolarizing light emitted from the optical fiber, there is a problem that a quantity of light incident on the displacement detector will be decreased, as light enters the displacement detector by extracting optional polarized light after depolarizing light once.

In addition, in a method to increase extinction ratio of light incident on the polarization maintaining fiber, decrease of light quantity does not occur, but there is a problem of high manufacturing cost, as it is necessary to perform alignment of optical axes at each fitting portion precisely, when adding optical connector or the like.

In addition, recently, as resolution of an A/D convertor comprised in the displacement detection device increases, a leakage of polarized beam having component orthogonal to optical axis of the polarization maintaining fiber becomes a problem, and there is a necessity to make interference amplitude by unnecessary light to be set within quantization error of the A/D convertor.

As a displacement detection device capable of stably and accurately detecting an amount of displacement, by attenuating an interference with unnecessary beam without causing a loss of light quantity, and also, by eliminating conventional measure for supplying beam with high extinction ratio to the displacement detector, the applicant previously proposed a displacement detection device comprising a polarization maintaining fiber for transmitting light from a light source to the displacement detector, and having a length not to be equal to a length obtained by dividing, a product of an even multiple of twice a length of a resonator times a refractive index of the resonator and a beat length obtained from a difference between propagation constants of two polarization modes, by a wavelength of the light source, or the polarization maintaining fiber having a length larger than a length obtained by dividing, a product of a coherent length and a beat length obtained from a difference between propagation constants of two polarization modes, by the wavelength of the light source (Patent Literature 3).

However, on the premise that optical axes (X axis, Y axis) of optical fibers will not be interchanged when fitting the optical fibers, it is configured to make unnecessary light not to interfere only with either delay or advance of phase with respect to main light to be used as an interference signal.

Considering the above prior circumstances, the purpose of the present invention is to provide a displacement detection device capable of stably and accurately detecting an amount of displacement, by attenuating an interference with unnecessary beam without causing a loss of light quantity, and also, by eliminating conventional measure for supplying a beam with high extinction ratio to a displacement detector, and further, by enabling selection of phase difference of unnecessary light with respect to main light from both delay or advance of phase by interchanging X axis and Y axis.

A displacement detection device of first invention is a displacement detection device comprising: a low-coherence laser light source for emitting light and having a plurality of oscillation spectra associated with a length of a resonator; a lens for focusing light from the laser light source; a polarization maintaining fiber for transmitting light focused by the lens, and having a length not to be equal to a length obtained by dividing, a product of an integral multiple of twice a length of a resonator times a refractive index of the resonator and a beat length obtained from a difference between propagation constants of two polarization modes, by a wavelength of the light source, which is selected from a range including a length equal to the above length; and a displacement detector for dividing a beam transmitted by the polarization maintaining fiber into two beams and for converting respective beams to an interference signal by causing the respective beams to interfere with each other, in order to set a change of phase applied to the respective beams to an amount of displacement, wherein the polarization maintaining fiber includes a plurality of polarization maintaining fibers fitted to each other by removable connectors, and when a plurality of fitting portions exists, in order of connection of the polarization maintaining fibers, a total length of the polarization maintaining fibers including a last polarization maintaining fiber and any combinations of other polarization maintaining fibers except the last polarization maintaining fiber is set not to be equal to a length obtained by dividing, a product of an integral multiple of twice the length of the resonator times the refractive index of the resonator and a beat length obtained from a difference between propagation constants of X and Y polarization modes of the polarization maintaining fiber, by the wavelength of the light source.

A displacement detection device of second invention is a displacement detection device comprising: a low-coherence light source for emitting light and having a coherence length; a lens for focusing light from the light source; a polarization maintaining fiber for transmitting light focused by the lens, and having a length larger than a length obtained by dividing, a product of the coherence length and a beat length obtained from a difference between propagation constants of two polarization modes, by a wavelength of the light source; and a displacement detector for dividing a beam transmitted by the polarization maintaining fiber into two beams and for converting respective beams to an interference signal by causing the respective beams to interfere with each other, in order to set a change of phase applied to the respective beams to an amount of displacement, wherein the polarization maintaining fiber includes a plurality of polarization maintaining fibers fitted to each other by removable connectors, and a length of respective polarization maintaining fibers is set to 2 m*L (wherein m is an integer larger than 0, L is a length of shortest polarization maintaining fiber), and also, there is no same combination in the length of the respective polarization maintaining fibers.

According to the present invention, an interference with unnecessary beam is attenuated by configuring the polarization maintaining fiber to be an optional length according to oscillation characteristic of a light source. Therefore, a component that causes a phase fluctuation in a displacement detection signal of the displacement detection device is minimized and only a fluctuation in amplitude of an interference signal is allowed, thereby allowing for the displacement detection less susceptible to a stress from the outside of the polarization maintaining fiber. According to the present invention, use efficiency of light from the light source is excellent as there is no loss of light quantity, and further, conventional measure for supplying a beam with high extinction ratio to the displacement detector is eliminated.

Further, in the present invention, the polarization maintaining fiber includes a plurality of polarization maintaining fibers fitted to each other by removable connectors, and when a plurality of fitting portions exists, in order of connection of the polarization maintaining fibers, a total length of the polarization maintaining fibers including a last polarization maintaining fiber and any combinations of other polarization maintaining fibers except the last polarization maintaining fiber is set not to be equal to a length obtained by dividing, a product of an integral multiple of twice the length of the resonator times the refractive index of the resonator and a beat length obtained from a difference between propagation constants of X and Y polarization modes of the polarization maintaining fiber, by the wavelength of the light source, therefore, phase difference of unnecessary light with respect to main light can be selected from both delay or advance of phase by interchanging X axis and Y axis.

DETAILED DESCRIPTION OF THE INVENTION

Hereinafter, a displacement detection device according to examples of one embodiment of the present invention (Hereinafter, referred to as "present example".) is explained by referring to the attached drawings. At first, three examples of whole configuration of a displacement detection device applying the present invention are explained in FIGS. 1 to 3.

1. Example of Whole Configuration of Displacement Detection Device (Example for Displacing Diffraction Grating)

Figure 1:
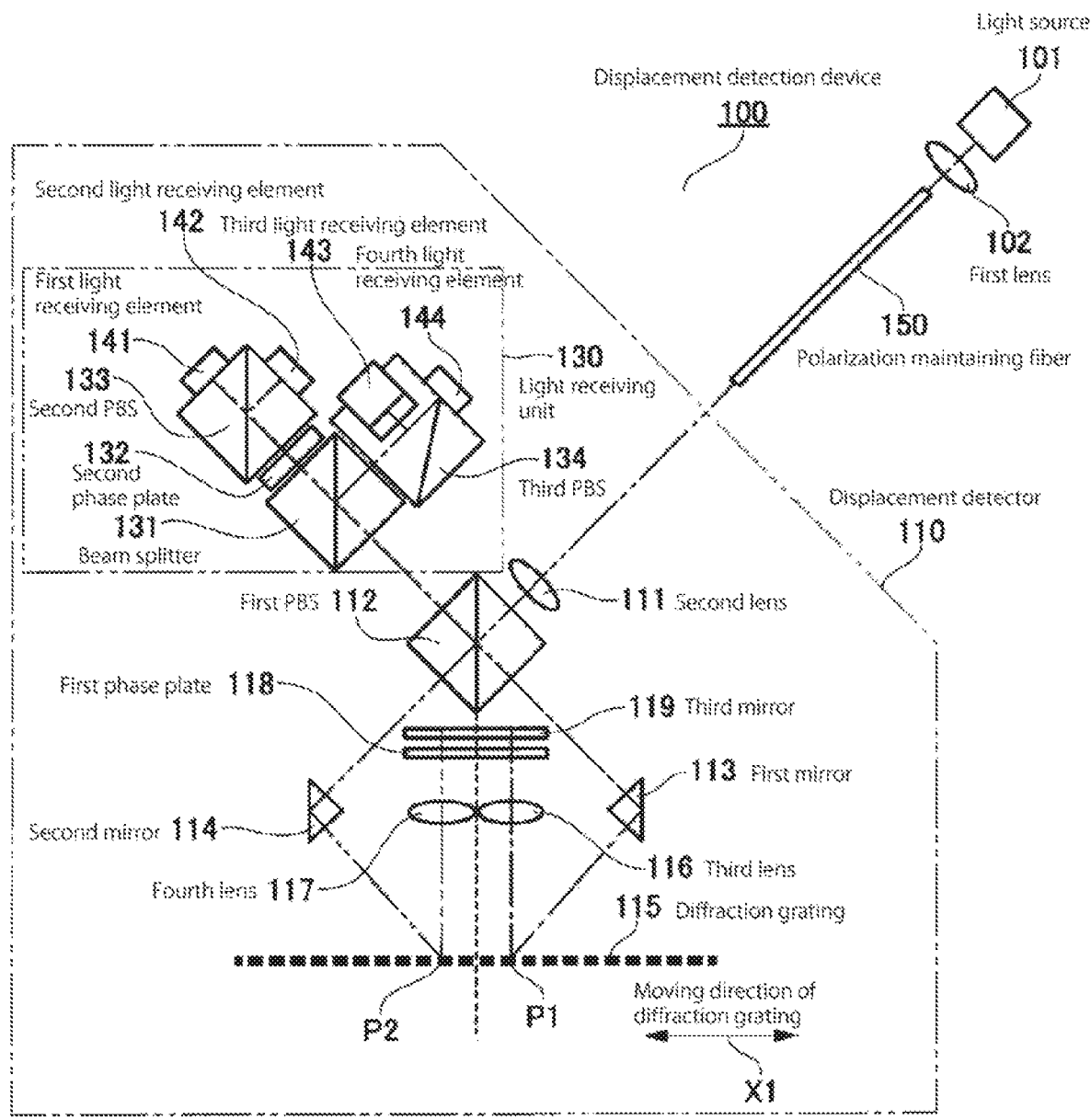
FIG. 1 is a block diagram illustrating an example of a displacement detection device (example for displacing diffraction grating) applying the present invention.

FIG. 1 illustrates an example of configuration of a displacement detection device 100 for displacing a diffraction grating, in conjunction with a displacement of a surface to be measured.

The displacement detection device 100 comprises a light source 101. A laser, an LED or the like can be used as the light source 101. When using a laser as the light source 101, a low-coherence multimode semiconductor laser diode may be used. A self-pulsation laser diode and a super luminescence diode are included in the semiconductor laser.

In addition, a YAG laser, an Nd laser, a titan-sapphire laser, a fiber laser, or the like are included in a solid-state laser used as the light source 101. Further, a helium-cadmium laser (metal laser) and a dye laser (liquid laser) are included in a laser used as the light source 101. In addition, it is preferable that the light source 101 oscillates continuously, has a wide oscillation wavelength in a longitudinal mode, and has a low coherence.

Alternately, a single-mode semiconductor laser whose coherence is lowered by high-frequency superimposition may be used as the light source 101.

A beam emitted from the light source 101 is focused by a first lens 102 and enters the polarization maintaining fiber 150. The polarization maintaining fiber 150 is an optical fiber having a different refractive index distribution between a vertical direction and a horizontal direction of a cross section of a core, and it will be described in detail later. In addition, it is preferable that a polarized light of the light source 101 enters the polarization maintaining fiber 150 with its optical axis aligned with an optical axis along which a polarization in the core cross section of the polarization maintaining fiber 150 is maintained, but the both optical axes may not be aligned precisely. A length of the polarization maintaining fiber 150 is determined by conditions described later.

The beam transmitted by the polarization maintaining fiber 150 enters a displacement detector 110.

The beam incident on the displacement detector 110 is incident on a first polarizing beam splitter (PBS) 112 via a second lens 111. The first polarizing beam splitter 112 divides the beam into an S-polarized beam and a P-polarized beam. For example, the S-polarized beam is reflected by the first polarizing beam splitter 112, and P-polarized beam transmits through the first polarizing beam splitter 112.

The S-polarized beam reflected by the first polarizing beam splitter 112 is incident on a diffraction grating 115 via a first mirror 113. In addition, the P-polarized beam transmitted through the first polarizing beam splitter 112 is incident on the diffraction grating 115 via a second mirror 114.

The diffraction grating 115 functions as a scale for detecting an amount of displacement of a surface to be measured, and moves in conjunction with the displacement of the surface to be measured, as indicated by an arrow X1.

A diffraction light of each beam incident on the diffraction grating 115 is incident on a third mirror 119 via a third lens 116 or a fourth lens 117 and a first phase plate 118, and each beam reflected by the third mirror 119 is returned to the diffraction grating 115. The first phase plate 118 includes, for example a ¼ wavelength plate.

A diffraction light of the beam returned to the diffraction grating 115 is returned to the first polarizing beam splitter 112 via the first mirror 113 or the second mirror 114. Here, as each beam passes through the first phase plate 118 twice, the S-polarized light returns as the P-polarized light and the P-polarized light returns as the S-polarized light.

Therefore, two beams returned from the diffraction grating 115 are emitted in a superimposed state from a surface different from the incident surface of the first polarizing beam splitter 112 of the beam from the light source 101, and the superimposed beam enters a light receiving unit 130.

The beam incident on the light receiving unit 130 is incident on a beam splitter 131, and is divided into two beams. One of the beams divided into two beams is incident on a second polarizing beam splitter 133 via a second phase plate 132. The beam incident on the second polarizing beam splitter 133 is incident on a first light receiving element 141 and a second light receiving element 142, after being divided into each polarization component. In addition, other one of the beams divided into two beams is incident on a third polarizing beam splitter 134, and then, is incident on a third light receiving element 143 and a fourth light receiving element 144, after being divided into each polarization component.

Next, explaining about how the displacement detection device 100 detects the displacement of the diffraction grating 115. The beam emitted from the light source is focused by the first lens 102 and enters an end surface of the polarization maintaining fiber 150. The beam emitted from the polarization maintaining fiber 150 is collimated by the second lens 111. The collimated beam is incident on the first polarizing beam splitter 112 in a polarization state that it is divided into two as 1:1 by the first polarizing beam splitter 112. One of the beams divided into two beams by the first polarizing beam splitter 112, which is having an S-polarized component, passes through the first mirror 113 and is incident on a position P1 of the diffraction grating 115. The beam vertically diffracted by the diffraction grating 115 results in circularly-polarized light by the first phase plate 118, and then, reflected by the third mirror 119 to return to the diffraction grating 115 side. At this time, the beam results in a beam having a P-polarized component by transmitting through the first phase plate 118 again, and then, results in a light diffracted twice by the diffraction grating 115, and is directed toward the first polarizing beam splitter 112.

The beam having a P-polarized component divided by the first polarizing beam splitter 112 passes through the second mirror 114 and is incident on a position P2 of the diffraction grating 115. The beam vertically diffracted by the diffraction grating 115 results in circularly-polarized light by the first phase plate 118, and then, reflected by the third mirror 119 to return to the diffraction grating 115 side. At this time, the beam results in a beam having a S-polarized component by transmitting through the first phase plate 118 again, and then, results in a light diffracted twice by the diffraction grating 115, and is directed toward the first polarizing beam splitter 112.

The two beams whose polarization components are interchanged with each other are superimposed by the first polarizing beam splitter 112 and directed toward the light receiving unit 130. The superimposed beam is having an S-polarized component and a P-polarized component of linearly-polarized light. This beam is divided into two beams by the beam splitter 131, and one of the beams divided into two beams is incident on the second polarizing beam splitter 133 via the second phase plate 132.

When passing through the second phase plate 132, the linearly-polarized lights being orthogonal to each other result in a superimposition of circularly-polarized lights rotating in directions opposite to each other. Then, a polarizing direction of the linearly-polarized light incident on the second polarizing beam splitter 133 rotates twice when the diffraction grating 115 moves only for one wavelength in a moving direction. Therefore, an interference signal $A\cos(4Kx+\delta')$ is obtained by the first receiving element 141 and the second receiving element 142. Here, A is an amplitude of the interference signal, K is a wave number represented by $2\pi/\Lambda$, x represents an amount of movement of the diffraction grating, $\delta$ is an initial phase, and $\Lambda$ is a grating pitch of the diffraction grating.

In addition, other one of the beams divided into two beams by the beam splitter 131 is incident on the third polarizing beam splitter 134. In this case, as the third polarizing beam splitter 134 is rotated for 45 degrees with respect to an optical axis of the second polarizing beam splitter 133, a phase of a signal to be photoelectrically converted in the third light receiving element 143 and the fourth light receiving element 144 differs by 90 degrees from which in the first light receiving element 141 and the second light receiving element 142. Therefore, a moving direction of the diffraction grating can be recognized.

As such, the displacement detection device 100 can detect an interference signal as an amount of displacement of the diffraction grating 115 in the X1 direction, from light receiving states in the first to fourth light receiving elements 141 to 144.

In addition, the interference signal obtained by the four light receiving elements 141 to 144 does not contain a component related to a wavelength of the light source 101. Therefore, an interference intensity will not be affected, even if a fluctuation in a wavelength of the light source occurs due to a change in atmospheric pressure, humidity, and/or temperature.

2. Example of Whole Configuration of Displacement Detection Device (Example of Michelson's Interferometer Type)

Figure 2:
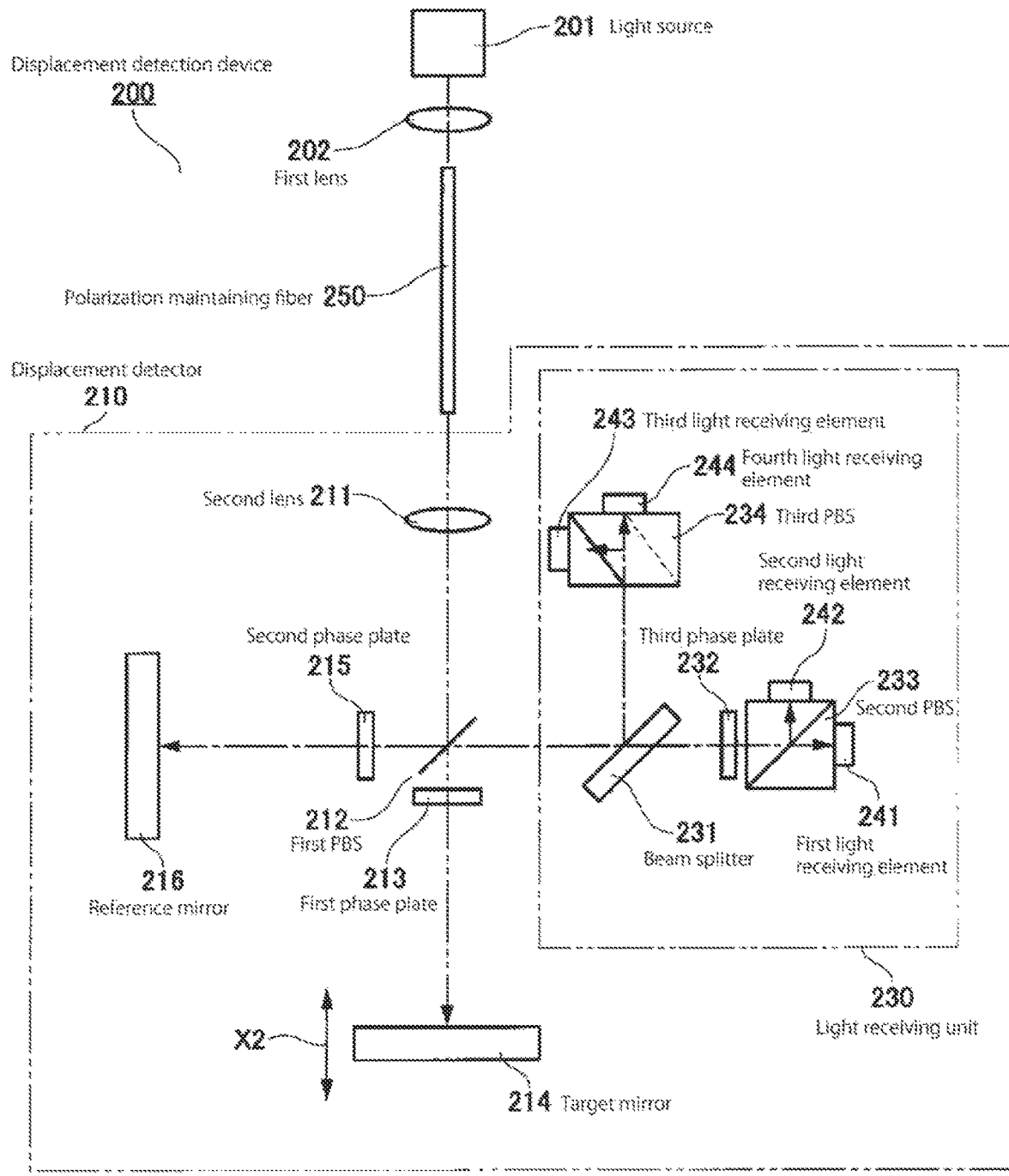
FIG. 2 is a block diagram illustrating an example of a displacement detection device (example of Michelson's interferometer type) applying the present invention.

FIG. 2 illustrates an example of configuration of a displacement detection device 200 of Michelson's interferometer type, in which a target mirror 214 is moved in conjunction with a displacement of a surface to be measured.

The displacement detection device 200 comprises a light source 201. The conditions applicable as the light source 201 are same as the conditions of the light source 101 described in the displacement detection device 100 illustrated in FIG. 1, and for example, a low-coherence light source, a multi-mode semiconductor laser, or the like is used as the light source.

The beam emitted from the light source 201 is focused by a first lens 202, and enters a polarization maintaining fiber 250. The polarization maintaining fiber 250 is an optical fiber having a different refractive index distribution between a vertical direction and a horizontal direction of a cross section of a core, and a length of the polarization maintaining fiber 250 is determined by conditions described later.

The beam transmitted by the polarization maintaining fiber 250 enters a displacement detector 210.

The beam incident on the displacement detector 210 is incident on a first polarizing beam splitter 212 via a second lens 211. A P-polarized beam transmitted through the first polarizing beam splitter 212 is incident on a target mirror 214 via a first phase plate 213. The target mirror 214 moves in an X2 direction in conjunction with a displacement of the surface to be measured. In addition, an S-polarized beam reflected by the first polarizing beam splitter 212 is incident on a reference mirror 216 via a second phase plate 215. The first phase plate 213 and the second phase plate 215 include, for example a ¼ wavelength plate.

In addition, when the target mirror 214 is located at a reference position, an optical path length from the first polarizing beam splitter 212 to the target mirror 214 and an optical path length from the first polarizing beam splitter 212 to the reference mirror 216 are set to be equal.

Then, the beams returned to the first polarizing beam splitter 212 from the target mirror 214 and the reference mirror 216 result in a superimposed interference signal, which enters a light receiving unit 230.

The beam incident on the light receiving unit 230 is incident on a beam splitter 231, and is divided into two beams. One of the beams divided into two beams is incident on a second polarizing beam splitter 233 via a third phase plate 232. The beam incident on the second polarizing beam splitter 233 is incident on a first light receiving element 241 and a second light receiving element 242, after being divided into each polarization component. In addition, other one of the beams divided into two beams is incident on a third polarizing beam splitter 234, and then, is incident on a third light receiving element 243 and a fourth light receiving element 244, after being divided into each polarization component.

By configuring as the above, among the beams supplied to the light receiving unit 230 from the first polarizing beam splitter 212, an optical path of the component of a beam reflected by the reference mirror 216 is constant. On the other hand, an optical path of the component of a beam reflected by the target mirror 214 changes in conjunction with a displacement of the surface to be measured.

Therefore, the displacement detection device 200 can detect an interference signal as an amount of displacement of the target mirror 214 in the X2 direction, from light receiving states in the first to fourth light receiving elements 241 to 244.

3. Example of Whole Configuration of Displacement Detection Device (Example Arranging Target Mirror and Reference Mirror in Parallel)

Figure 3:
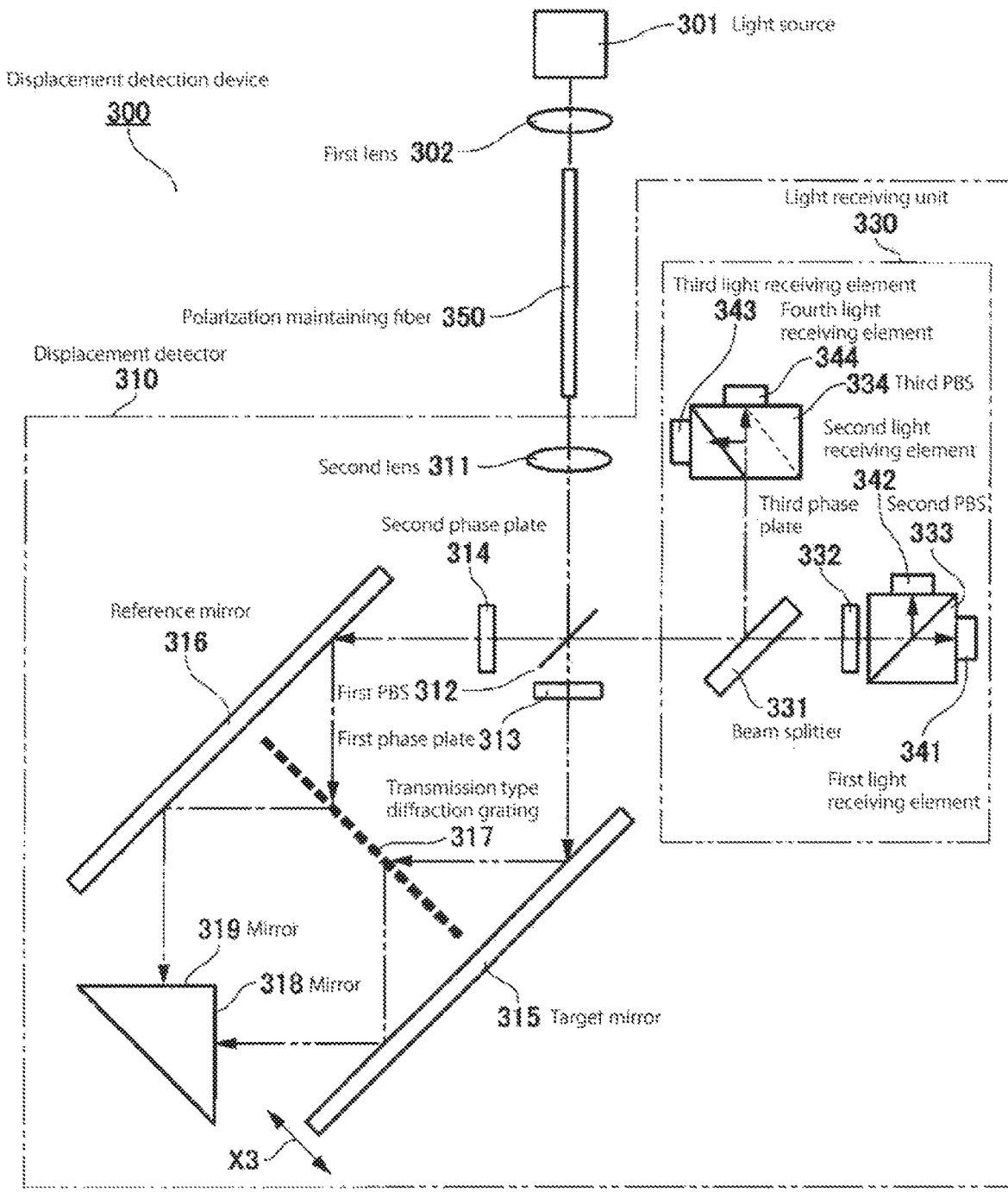
FIG. 3 is a block diagram illustrating an example of a displacement detection device (example arranging target mirror and reference mirror in parallel) applying the present invention.

FIG. 3 illustrates an example of configuration of a displacement detection device 300 arranging a target mirror 315 and a reference mirror 316 in parallel.

The displacement detection device 300 comprises a light source 301. The conditions applicable as the light source 301 are same as the conditions of the light source 101 described in the displacement detection device 100 illustrated in FIG. 1, and for example, a low-coherence light source, a multi-mode semiconductor laser, or the like is used as the light source.

The beam emitted from the light source 301 is focused by a first lens 302, and enters a polarization maintaining fiber 350. The polarization maintaining fiber 350 is an optical fiber having a different refractive index distribution between a vertical direction and a horizontal direction of a cross section of a core, and a length of the polarization maintaining fiber 350 is determined by conditions described later.

The beam transmitted by the polarization maintaining fiber 350 enters a displacement detector 310.

The beam incident on the displacement detector 310 is incident on a first polarizing beam splitter 312 via a second lens 311. A P-polarized beam transmitted through the first polarizing beam splitter 312 is incident on a target mirror 315 via a first phase plate 313. The first phase plate 313 includes, for example a ¼ wavelength plate. Here, the beam incident on the target mirror 315 is incident on the target mirror 315 at an angle of 45 degrees with respect to the target mirror 315. The target mirror 315 moves in an X3 direction in conjunction with a displacement of the surface to be measured.

The beam reflected by the target mirror 315 is incident on a transmission type diffraction grating 317, and the diffracted light transmitted through the transmission type diffraction grating 317 is incident on the target mirror 315. Then, the diffracted light reflected by the target mirror 315 is incident on a mirror 318. An incident angle of the diffracted light with respect to the mirror 318 is 90 degrees, and the mirror 318 reflects the diffracted light incident on the mirror 318 to the incident direction.

An S-polarized beam reflected by the first polarizing beam splitter 312 is incident on a reference mirror 316 via a second phase plate 314. The second phase plate 314 includes, for example a ¼ wavelength plate. Here, the beam incident on the reference mirror 316 is incident on the reference mirror 316 at an angle of 45 degrees with respect to the reference mirror 316.

The beam reflected by the reference mirror 316 is incident on a transmission type diffraction grating 317, and the diffracted light transmitted through the transmission type diffraction grating 317 is incident on the reference mirror 316. Then, the diffracted light reflected by the reference mirror 316 is incident on a mirror 319. An incident angle of the diffracted light with respect to the mirror 319 is 90 degrees, and the mirror 319 reflects the diffracted light incident on the mirror 319 to the incident direction.

The beams reflected by the mirrors 318, 319 are incident on the first polarizing beam splitter 312 through paths opposite to paths which are incident on the mirrors 318, 319. Then, the two beams returned to the first polarizing beam splitter 312 result in a superimposed interference signal, which enters a light receiving unit 330.

The beam incident on the light receiving unit 330 is incident on a beam splitter 331, and is divided into two beams. One of the beams divided into two beams is incident on a second polarizing beam splitter 333 via a third phase plate 332. The beam incident on the second polarizing beam splitter 333 is incident on a first light receiving element 341 and a second light receiving element 342, after being divided into each polarization component. In addition, other one of the beams divided into two beams is incident on a third polarizing beam splitter 334, and then, is incident on a third light receiving element 343 and a fourth light receiving element 344, after being divided into each polarization component.

By configuring as the above, among the beams supplied to the light receiving unit 330 from the first polarizing beam splitter 312, the component of a beam reflected by the reference mirror 316 is a beam passed through same position of the transmission type diffraction grating 317. On the other hand, the component of a beam reflected by the target mirror 315 is a beam passed through different position of the transmission type diffraction grating 317 by the movement of the target mirror 315 in the X3 direction. Therefore, the displacement detection device 300 can detect a phase component of the diffraction grating as an amount of displacement of the target mirror 315 in the X3 direction, from light receiving states in the first to fourth light receiving elements 341 to 344, as an interfering state of the interference signal superimposed by the first polarizing beams splitter 312 changes by a position of the target mirror 315.

In addition, in the configuration illustrated in FIG. 3, the optical path length does not change even if the position of the target mirror 315 changes.

4. Explanation of Polarization Maintaining Fiber

All the displacement detection devices 100, 200, 300 use the polarization maintaining fibers 150, 250, 350 for transmitting the beams between the light sources 101, 201, 301 and the displacement detectors 110, 210, 310.

Figure 4:
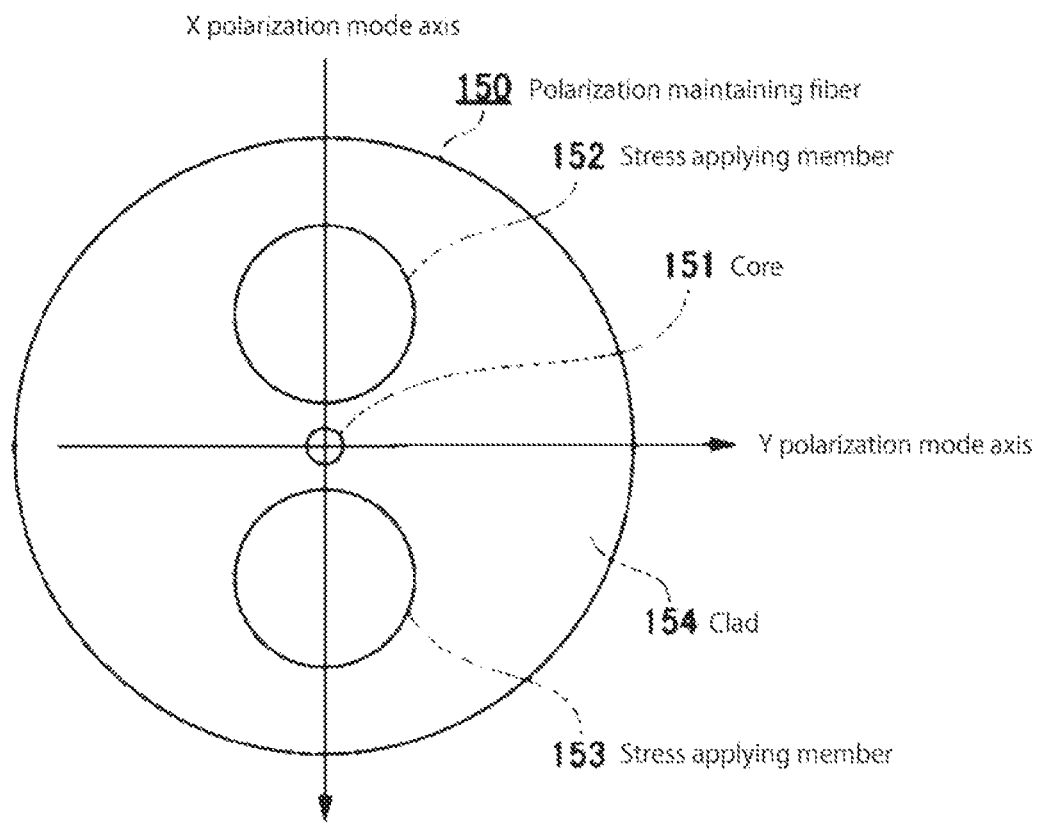
FIG. 4 is a sectional view illustrating a polarization maintaining fiber according to one embodiment of the present invention.

FIG. 4 illustrates a section of an example of configuration of the polarization maintaining fiber 150. Other polarization maintaining fibers 250, 350 also have same configuration as the polarization maintaining fiber 150.

The polarization maintaining fiber 150 comprises stress applying members 152, 153 above and below a core 151 for transmitting a beam. Then, the whole polarization maintaining fiber 150 is covered with a clad 154, in a state that the stress applying members 152, 153 are applying a stress to the core 151 from above and below.

In this example, the vertical direction along which a stress is applied to the core 151 is defined as X polarization mode axis, and a direction orthogonal to the X polarization mode axis is defined as Y polarization mode axis. Here, the X polarization mode axis serves as an optical axis along which polarization is maintained.

By the way, the beam passing through the polarization maintaining fiber 150 may contain the component (X-polarized mode) of the optical axis along which the polarization of the polarization maintaining fiber 150 is maintained, and the component (Y-polarized mode) being orthogonal to the component of X-polarized mode. Generally, the extinction ratio of a semiconductor laser is said to be approximately 20 dB, so it does not emit a perfect linearly-polarized light. Further, there is a variation in angle adjustment of an optical axis when the beam enters the polarization maintaining fiber 150.

By using the polarization maintaining fiber 150, the polarization is maintained for the component of the X polarization mode axis and the component of the Y polarization mode axis. However, the refractive index of the polarization component of the X polarization mode axis and the polarization component of the Y polarization mode axis in the core 151 are different from each other, so when a stress is applied to the polarization maintaining fiber 150, a phase difference is caused between a beam via the X polarization mode axis and a beam via the Y polarization mode axis.

Here, unless a light quantity of a beam via the Y polarization mode axis is sufficiently small with respect to a light quantity of a beam via the X polarization mode axis, the beam via the X polarization mode axis and the beam via the Y polarization mode axis will interfere with each other. Thereby, when a stress is applied to the polarization maintaining fiber 150, a slight phase change will be detected, and an accuracy of displacement detection will be deteriorated.

Therefore, in the present example, a coherence of the light source and a length of the polarization maintaining fiber 150 are defined to minimize the influences.

5. Example of Using Multimode Laser as Light Source

Next, explaining about the conditions for determining a length of the polarization maintaining fibers 150, 250, 350. There are two conditions for determining a length of the polarization maintaining fibers 150, 250, 350: a condition when a multimode laser is used as the light sources 101, 201, 301; and a condition when a light source having a wide band and a poor coherence is used as the light sources 101, 201, 301.

At first, explaining about the condition when the multimode laser is used as the light source.

A multimode semiconductor laser and a high-frequency superimposed single-mode semiconductor laser can be cited as a typical low-coherence laser light source having a plurality of oscillation spectra associated with a length of a resonator. Here, the length of the resonator is, for example in a case of a semiconductor laser, a distance between one end surface (mirror surface) and another end surface, and a wavelength λ of a laser beam is determined by the length of the resonator.

If a period from an interfering state where the optical path length difference is zero until when the interference intensity rises again and reaches a peak is defined as one cycle, a distance $L_{period}$ causing interference is given by Formula 1 below.

$$L_{period} = 2 \cdot n_{eff} L_{cav} \quad \text{[Formula 1]}$$

Here, $n_{eff}$ is a refractive index of a resonator, and $L_{cav}$ is a length of a resonator.

That is, Formula 1 means that a peak of interference intensity appears, in a beam, at an integral (m) multiple of a length obtained by multiplying twice the length of a resonator by the refractive index of a resonator.

Next, an optical delay distance D at an output end of the polarization maintaining fiber 150 between the component of the X polarization mode axis and the component of the Y polarization mode axis propagating through the polarization maintaining fiber 150 is given by Formula 2 below.

$$D = \lambda \cdot \frac{L_{fiber}}{L_{beat}} \quad \text{[Formula 2]}$$

Here, $\lambda$ represents a wavelength of a light source, $L_{fiber}$ represents a length of an optical fiber (length of polarization maintaining fiber), and $L_{beat}$ represents a beat length.

Here, if a difference between propagation constants ($\beta x$, $\beta y$) indicates a speed of light in the X polarization mode axis and the Y polarization mode axis propagating in the polarization maintaining fiber is expressed by the Formula $\Delta \beta = \beta x - \beta y$, the beat length can be expressed by Formula 3 below.

$$L_{beat} = 2\pi/\Delta\beta \quad \text{[Formula 3]}$$

That is, when the optical delay distance D generated from a difference between the propagation constants matches a distance causing an interference, a beam via the X polarization mode axis and a beam via the Y polarization mode axis interfere with each other.

Therefore, the length of the polarization maintaining fiber 150 is set to a length not to be equal to a length obtained by dividing, a product of an integral multiple of twice a length of a resonator times a refractive index of the resonator and a beat length obtained from a difference between propagation constants of X and Y polarization modes of the polarization maintaining fiber, by the wavelength of the light source. In this way, an interference between a beam via the X polarization mode axis and a beam via the Y polarization mode axis is avoided, so stable displacement detection can be performed against a stress on the polarization maintaining fiber 150.

Formula 4 below is a formula for calculating a length $L_{fiber}$ of an optical fiber.

$$mL_{period} = \lambda \cdot \frac{L_{fiber}}{L_{beat}} \quad \text{[Formula 4]}$$

$$m \cdot 2 \cdot n_{eff} L_{cav} = \lambda \cdot \frac{L_{fiber}}{L_{beat}}$$

$$L_{fiber} = \frac{2m n_{eff} L_{cav} L_{beat}}{\lambda}$$

Figure 5:
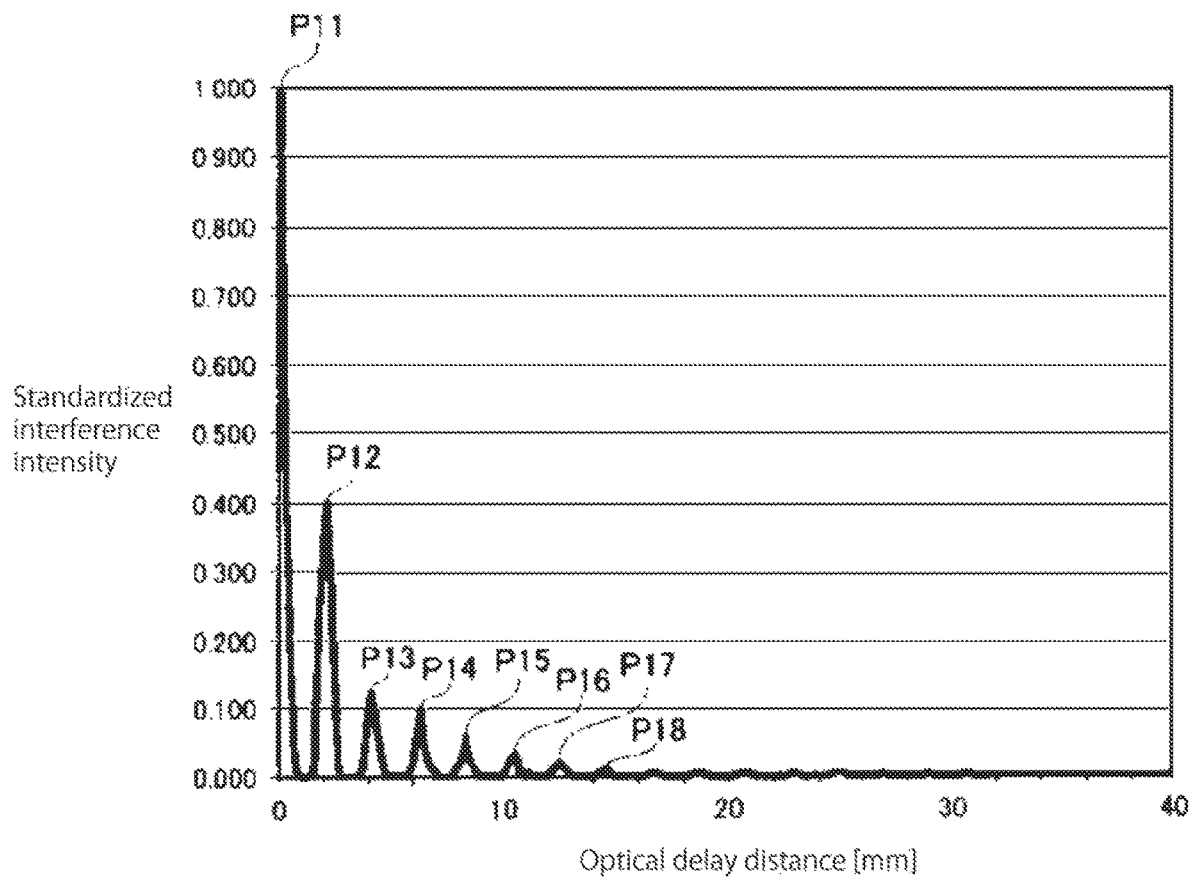
FIG. 5 is a characteristic diagram illustrating an example of a multimode laser according to one embodiment of the present invention.

In a case of a multimode semiconductor laser, an interference intensity between a beam via the X polarization mode axis and a beam via the Y polarization mode axis is, for example as illustrated in FIG. 5, where the beams hardly interfere with each other, as the optical delay distance increases. That is, when the interference intensity is defined as one when the optical delay distance is zero (position of peak P11), there are peaks P12, P13, P14 and so on, where the interference intensity becomes gradually weaker every time when the optical delay distance is separated for a fixed distance from zero, and interference intensity becomes approximately zero from a certain optical delay distance.

Here, setting a length of the polarization maintaining fiber 150 to avoid the interference between a beam via the X polarization mode axis and a beam via the Y polarization mode axis means to set the length of to have an optical delay distance at which the interference intensity, for example between peak P11 and peak P12 becomes approximately zero. The length may be set to a length having an optical delay distance at which the interference intensity between peaks other than between peak P11 and peak P12 becomes approximately zero.

6. Example of Using Light Source Having Wide Band and Poor Coherence

As a low-coherence light source having a coherence length, there is a light source having a specific wavelength width and whose intensity broadly changes with wavelength, without having a plurality of oscillation spectra associated with the length of the resonator as described above. For example, super luminescence diode and LED (light emitting diode) can be cited as such light source. Alternately, a titan-sapphire laser or the like can be cited as a solid-state laser.

When using such types of light sources as the light sources 101, 201, 301, a coherence length $L_{low}$ of the light source is measured in advance.

Figure 6:
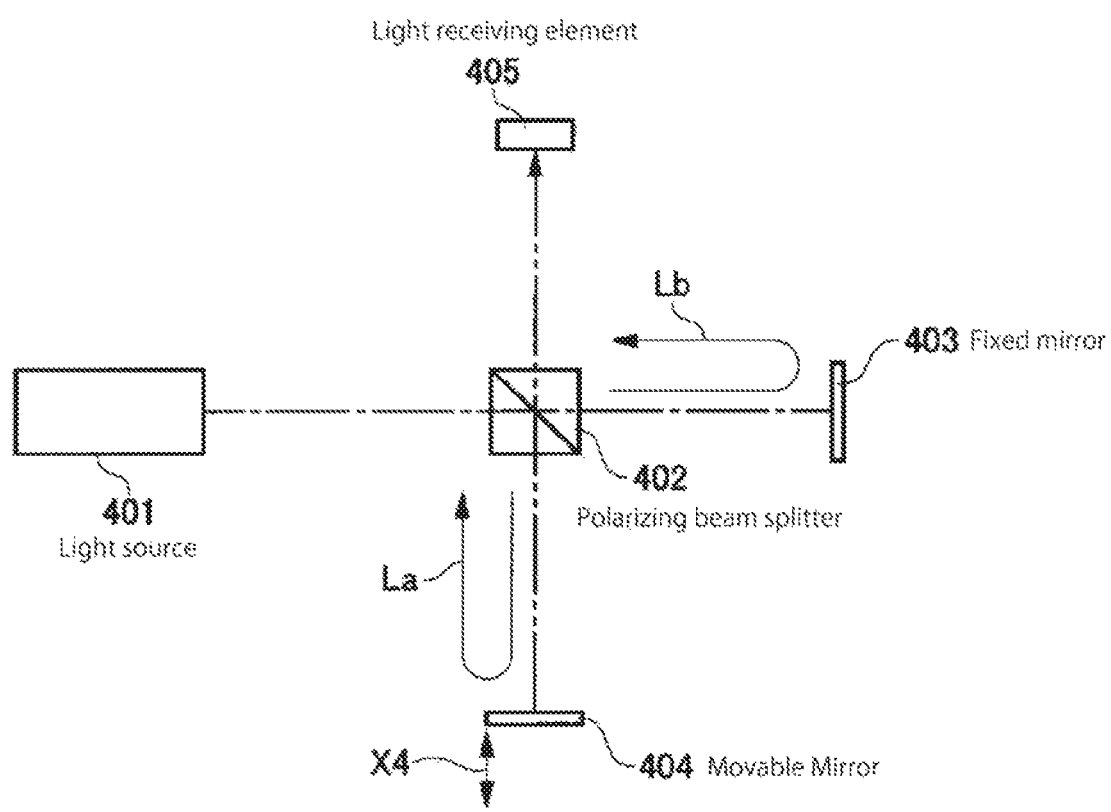
FIG. 6 is a block diagram illustrating an example of configuration for measuring a coherence length of a light source having a wide band and a poor coherence according to one embodiment of the present invention.

FIG. 6 illustrates an example of configuration for measuring a coherence length $L_{low}$ of a light source. In addition, FIG. 6 illustrates a principle for measuring a coherence length $L_{low}$, and configurations unnecessary for explaining a basic principle of measurement are omitted.

Here, a light source 401 is a light source to be measured. A beam emitted from the light source 401 is incident on a polarizing beam splitter 402, and divided into one and another polarization component. One polarization component is reflected by a fixed mirror 403 and returns to the polarizing beam splitter 402, another polarization component is reflected by a movable mirror 404 and returns to the polarizing beam splitter 402. A position of the movable mirror 404 moves in X4 direction.

And, two beams returned to the polarizing beam splitter 402 are incident on a light receiving element 405 in superimposed state.

Figure 7:
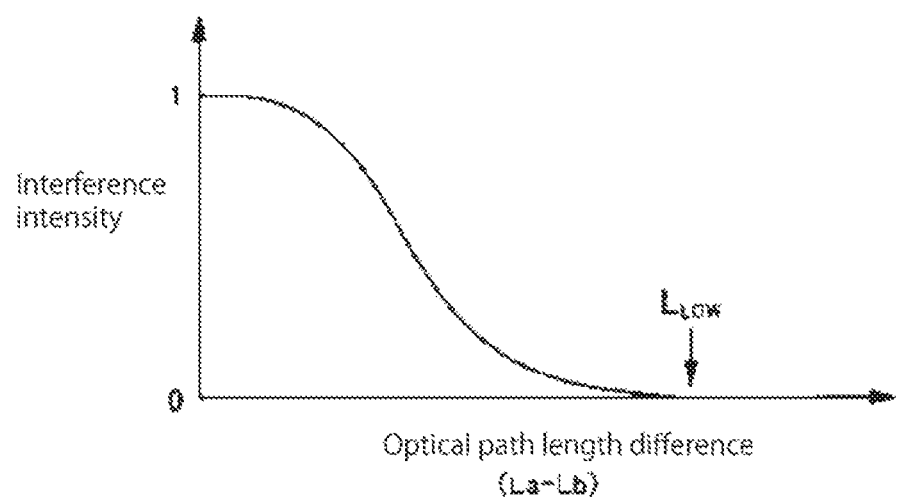
FIG. 7 is a characteristic diagram illustrating an example of a coherence length according to one embodiment of the present invention.

FIG. 7 illustrates interference intensity detected by the light receiving element 405.

Here, an optical path length (length in round trip) between the polarizing beam splitter 402 and the movable mirror 404 is La, and an optical path length (length in round trip) between the polarizing beam splitter 402 and the fixed mirror 403 is Lb. And, a horizontal axis of FIG. 7 represents an optical path length difference (La−Lb).

As can be seen from FIG. 7, when the optical path length difference (La−Lb) is zero, an interference intensity becomes maximum value of one, and hereinafter, the interference intensity becomes approximately zero as the optical path length difference increases. For example, the optical path length difference where the interference intensity became 1/1000 from the maximum value of one will be the coherence length $L_{low}$ of a light source.

And, a product of the coherence length $L_{low}$ of a light source calculated as the above and a beat length obtained from a difference between propagation constants of X and Y polarization modes of the polarization maintaining fiber 150 is calculated, and a length of the polarization maintaining fiber 150 is set to be longer than a length obtained by dividing the product of the coherence length and the beat length by a wavelength of the light source 101. The displacement detection device 100 using the polarization maintaining fiber 150 with such length can avoid the interference between a beam via the X polarization mode axis and a beam via the Y polarization mode axis, so stable displacement detection can be performed against a stress on the polarization maintaining fiber 150.

Generally, the low-coherence light source has wider wavelength width than a multimode semiconductor laser and has very short coherence length $L_{low}$, so a length $L_{fiber}$ of the optical fiber rarely becomes very long.

Formula 5 is a formula expressing conditions for determining a length $L_{fiber}$ of the polarization maintaining fiber 150.

$$L_{low} \leq \frac{L_{fiber}}{L_{beat}} \lambda \therefore L_{fiber} \geq \frac{L_{low} L_{beat}}{\lambda} \quad \text{[Formula 5]}$$

As explained in the above, even when using any light source, the interference between a beam via the X polarization mode axis and a beam via the Y polarization mode axis can be avoided by determining a length of the polarization maintaining fiber by the above conditions. Therefore, according to the displacement detection device of the present example, stable displacement detection can be performed against a stress, such as bending, applied to the optical fiber, and an accuracy of displacement detection will be improved. In addition, it is preferable that a polarized beam emitted from a light source enters the polarization maintaining fiber such that an optical axis of the polarized beam is aligned with an optical axis along which the polarization in the core cross section of the polarization maintaining fiber is maintained, but in a cases of the present example, accuracy can be maintained even if an optical axis at an end surface of the polarization maintaining fiber is not aligned strictly.

In addition, in the above explanation, conditions of the length of polarization maintaining fiber 150 used in the displacement detection device 100 are indicated, but conditions of the length of polarization maintaining fibers 250, 350 used in the displacement detection devices 200, 300 illustrated in FIGS. 2 and 3 can be determined in a similar manner.

7. Example Combining Plurality of Fibers

The polarization maintaining fiber 150, 250, 350 in the displacement detection device 100, 200, 300 may include a plurality of polarization maintaining fibers connected to each other.

Figure 8:
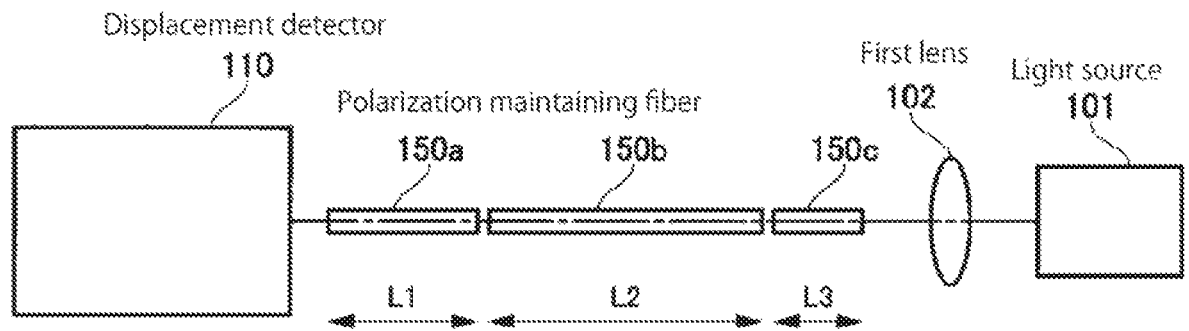
FIG. 8 is a block diagram illustrating an example connecting a plurality of polarization maintaining fibers according to one embodiment of the present invention.

For example, as illustrated in FIG. 8, a beam emitted from the light source 101 may enter three polarization maintaining fibers 150a, 150b, 150c fitted and connected to each other, via the first lens 102. The beam transmitted through the three polarization maintaining fibers 150a, 150b, 150c enters the displacement detector 110.

Here, the fitting of the polarization maintaining fibers 150a, 150b, 150c indicates a state in which end surfaces of the polarization maintaining fibers 150a, 150b, 150c are connected to each other without a gap. Such fitting state can be realized by using, for example (unillustrated) connectors attached to the polarization maintaining fibers.

It is necessary to set a length of each of the polarization maintaining fibers 150a, 150b, 150c to a length considering a coherence of a light source according to a type of a light source as described above, but also, following conditions will be added. That is, it is necessary to take a countermeasure against an interference between a beam via the X polarization mode axis and a beam via the Y polarization mode axis from a leakage of the beams of the X polarization mode axis and the Y polarization mode axis generated from a fitting portion between the respective polarization maintaining fibers 150a, 150b, 150c.

For example, if polarization maintaining fibers having same length are fitted to each other, there is a possibility that a beam via an X+Y polarization mode axis and a beam via a Y+X polarization mode axis will interfere with each other by a leakage at the fitting portion.

When a plurality of fitting portions exists, in order of connection of the polarization maintaining fibers, a total length of the polarization maintaining fibers including a last polarization maintaining fiber (for example, polarization maintaining fiber 150a in FIG. 8) and any combinations of other polarization maintaining fibers (for example, polarization maintaining fibers 150b, 150c in FIG. 8) except the last polarization maintaining fiber is set not to be equal to a length obtained by dividing, a product of an integral multiple of twice the length of the resonator times the refractive index of the resonator and a beat length obtained from a difference between propagation constants of X and Y polarization modes of the polarization maintaining fiber, by the wavelength of the light source. By such conditions, it is possible to reduce a number of combinations of interferences having large influence on an interference between main components, in an interference between lights, which are emitted from the last polarization maintaining fiber, having different propagation phase difference caused by a fitting portion. In addition, it is possible to neglect each interference between components other than combinations of interferences having large influence on an interference between main components, as they are originally sufficiently small.

For example, in a case of a polarization maintaining fiber propagating a light having an X polarization mode as main component, when main component is interfered with the X polarization mode of a next polarization maintaining fiber, there is a component leaking to the Y polarization mode. Here, by having a plurality of fitting portions, various leakage components are generated, but an interference between the Y polarization modes can be neglected as it is sufficiently small.

In addition, when using a light source having wide band and poor coherence, a length of respective polarization maintaining fibers 150a, 150b, 150c is set to 2 m*L (m is an integer more than zero, L is a length of shortest polarization maintaining fiber), and also, there is no same combination in the length of the respective polarization maintaining fibers.

For example, the lengths of the respective polarization maintaining fibers need to satisfy L1≠L2≠L3, such as L1=2*L3 and L2=4*L3.

Here, when the optical axes (X axis, Y axis) of the optical fibers do not interchange at the time of fitting, unnecessary light will not be interfered only with either delay or advance of phase with respect to main light to be used as interference signal, but by interchanging X axis and Y axis at the time of fitting, phase difference of unnecessary light with respect to main light can be selected from both delay or advance of phase, so it is possible to generate a state that a relation of phase for avoiding an interference to main light by unnecessary light will be different, by interchanging polarization axes even if the lengths of the fibers are same.

In the displacement detection device applying the present invention, a plurality of the polarization maintaining fibers are fitted to each other by removable connectors, and when a plurality of fitting portions exists, in order of connection of the polarization maintaining fibers, a total length of the polarization maintaining fibers including a last polarization maintaining fiber and any combinations of other polarization maintaining fibers except the last polarization maintaining fiber is set not to be equal to a length obtained by dividing, a product of an integral multiple of twice the length of the resonator times the refractive index of the resonator and a beat length obtained from a difference between propagation constants of X and Y polarization modes of the polarization maintaining fiber, by the wavelength of the light source.

In the displacement detection device relating to the present invention, an interference with unnecessary beam is attenuated by configuring the polarization maintaining fiber to be an optional length according to oscillation characteristic of a light source. Therefore, a component that causes a phase fluctuation in a displacement detection signal of the displacement detection device is minimized and only a fluctuation in amplitude of an interference signal is allowed, thereby allowing for the displacement detection less susceptible to a stress from the outside of the polarization maintaining fiber. According to the present invention, use efficiency of light from the light source is excellent as there is no loss of light quantity, and further, conventional measure for supplying beam with high extinction ratio to the displacement detector is eliminated. Further, by interchanging X axis and Y axis at the time of fitting, phase difference of unnecessary light with respect to main light can be selected from both delay or advance of phase.

8. Modified Example

In addition, the displacement detection device applying the present invention may detect a displacement with a principle and a configuration different from the three displacement detection devices 100, 200, 300 illustrated in FIGS. 1, 2 and 3. That is, as long as the displacement detection device is having a configuration to guide light from a light source to the displacement detection device through the polarization maintaining fiber, it can be applied to other configurations.

In addition, in an example of FIG. 8 using a plurality of polarization maintaining fibers, it is illustrating an example applied to the displacement detection device 100 of an example of FIG. 1, but same conditions can be applied to conditions of a length of the respective polarization maintaining fibers, when using a plurality of polarization maintaining fibers in the displacement detection devices 200, 300 illustrated in FIGS. 2 and 3. Further, FIG. 8 is illustrating an example for fitting three polarization maintaining fibers 150a, 150b, 150c, but same conditions as the above example can be applied to a case in which two, four or more polarization maintaining fibers are fitted to each other.

Glossary of Drawing References

100 Displacement detection device
101 Light source
102 First lens
110 Displacement detector
111 Second lens
112 First polarizing beam splitter
113 First mirror
114 Second mirror
115 Diffraction grating
116 Third lens
117 Fourth lens
118 First phase plate
119 Third mirror
130 Light receiving unit
131 Beam splitter
132 Second phase plate
133 Second polarizing beam splitter
134 Third polarizing beam splitter
141 First light receiving element
142 Second light receiving element
143 Third light receiving element
144 Fourth light receiving element
150, 150a, 150b, 150c Polarization maintaining fiber
151 Core
152, 153 Stress applying member
154 Clad
200 Displacement detection device
201 Light source
202 First lens
210 Displacement detector
211 Second lens
212 First polarizing beam splitter
213 First phase plate
214 Target mirror
215 Second phase plate
216 Reference mirror
230 Light receiving unit
231 Beam splitter
232 Third phase plate
233 Second polarizing beam splitter
234 Third polarizing beam splitter
241 First light receiving element
242 Second light receiving element
243 Third light receiving element
244 Fourth light receiving element
250 Polarization maintaining fiber
300 Displacement detection device
301 Light source
302 First lens
310 Displacement detector
311 Second lens
312 First polarizing beam splitter
313 First phase plate
314 Second phase plate
315 Target mirror
316 Reference mirror
317 Transmission type diffraction grating
318, 319 Mirror
330 Light receiving unit
331 Beam splitter
332 Third phase plate
333 Second polarizing beam splitter
334 Third polarizing beam splitter
341 First light receiving element
342 Second light receiving element
343 Third light receiving element
344 Fourth light receiving element
350 Polarization maintaining fiber
401 Light source
402 Polarizing beam splitter
403 Fixed mirror
404 Movable Mirror
405 Light receiving element

The invention claimed is:

1. A displacement detection device comprising:
  a low-coherence laser light source for emitting light and having a plurality of oscillation spectra associated with a length of a resonator;

a lens for focusing light from the laser light source;
a polarization maintaining fiber for transmitting light focused by the lens, and having a length $L_{fiber}$ that satisfies $$(a) L_{fiber} \neq (2m\, n_{eff} L_{cav} L_{beat})/\lambda$$

where m is an integer larger than 0, $L_{cav}$ is the length of the resonator, $n_{eff}$ is a refractive index of the resonator, $L_{beat}$ is a beat length obtained from a difference between propagation constants of two polarization modes of the polarization maintaining fiber, and $\lambda$ is a wavelength of the light source, wherein the length $L_{fiber}$ is selected to lie between $(2\,m\, n_{eff}\, L_{cav}\, L_{beat})/\lambda$ and $(2(m+1)\, n_{eff}\, L_{cav}\, L_{beat})/\lambda$; and
a displacement detector for dividing a beam transmitted by the polarization maintaining fiber into two beams and for converting respective beams to an interference signal by causing the respective beams to interfere with each other, in order to set a change of phase applied to the respective beams to an amount of displacement,
wherein the polarization maintaining fiber includes a plurality of polarization maintaining sub-fibers fitted to each other by removable connectors, and when a plurality of fitting portions exists, in order of connection of the polarization maintaining sub-fibers, a total length of any combination of the polarization maintaining sub-fibers including a last polarization maintaining sub-fiber and any combinations of other polarization maintaining sub-fibers except the last polarization maintaining fiber that satisfies (a); and
wherein, when fitting the polarization maintaining sub-fibers, X and Y polarization mode axes of one polarization maintaining sub-fiber are interchanged with X and Y polarization mode axes of another polarization maintaining sub-fiber.

2. A displacement detection device comprising:
a low-coherence light source for emitting light and having a coherence length;
a lens for focusing light from the light source;
a polarization maintaining fiber (150) for transmitting light focused by the lens (102), and having a length $L_{fiber}$ satisfying $$(a) L_{fiber} \geq (L_{low}\, L_{beat})/\lambda,$$

where $L_{low}$ is the coherence length of the light, $L_{beat}$ a beat length obtained from a difference between propagation constants of two polarization modes of the polarization maintaining fiber, and $\lambda$ a wavelength of the light source; and
a displacement detector for dividing a beam transmitted by the polarization maintaining fiber into two beams and for converting respective beams to an interference signal by causing the respective beams to interfere with each other, in order to set a change of phase applied to the respective beams to an amount of displacement,
wherein the polarization maintaining fiber includes a plurality of polarization maintaining sub-fibers fitted to each other in series by removable connectors, a length of a shortest of the polarization maintaining sub-fibers is L, a length of each other of the polarization maintaining sub-fibers is set to 2 m*L, with m is an integer larger than 0, and the lengths of each of the polarization maintaining sub-fibers differ from each other; and
wherein, when fitting the polarization maintaining sub-fibers, X and Y polarization mode axes of one polarization maintaining sub-fiber are interchanged with X and Y polarization mode axes of another polarization maintaining sub-fiber, the X and Y polarization mode axes having different propagation constants.

* * * * *